(12) United States Patent
Hata

(10) Patent No.: US 9,870,978 B2
(45) Date of Patent: Jan. 16, 2018

(54) HEAT SPREADING IN MOLDED SEMICONDUCTOR PACKAGES

(71) Applicant: Altera Corporation, San Jose, CA (US)

(72) Inventor: William H Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 343 days.

(21) Appl. No.: 13/781,368

(22) Filed: Feb. 28, 2013

(65) Prior Publication Data

US 2014/0239483 A1    Aug. 28, 2014

(51) Int. Cl.
H01L 23/34 (2006.01)
H01L 23/433 (2006.01)
H01L 23/367 (2006.01)

(52) U.S. Cl.
CPC .......... *H01L 23/433* (2013.01); *H01L 23/367* (2013.01); *H01L 2224/13* (2013.01)

(58) Field of Classification Search
CPC .. H01L 23/433; H01L 23/367; H01L 2224/13
USPC ........................................................ 257/712
See application file for complete search history.

(56) References Cited

U.S. PATENT DOCUMENTS

| | | | |
|---|---|---|---|
| 6,396,700 B1 * | 5/2002 | Chu ................. | H01L 23/34 165/185 |
| 6,734,552 B2 * | 5/2004 | Combs ............. | H01L 23/4334 257/707 |
| 2002/0080587 A1 * | 6/2002 | Vinciarelli ......... | H01L 23/3735 361/713 |
| 2004/0150097 A1 | 8/2004 | Gaynes et al. | |
| 2007/0063216 A1 | 3/2007 | Hu et al. | |
| 2007/0200225 A1 * | 8/2007 | Ibrahim et al. ................ | 257/712 |
| 2008/0099902 A1 * | 5/2008 | Shih et al. ..................... | 257/679 |
| 2009/0053498 A1 * | 2/2009 | Matsuura et al. ............. | 428/220 |
| 2011/0012255 A1 * | 1/2011 | Suganuma ......... | H01L 23/3675 257/712 |

FOREIGN PATENT DOCUMENTS

TW          531816 B        5/2003

OTHER PUBLICATIONS

State Intellectual Property Office of the Peoples' Republic of China, Office Action for Patent Application 201410068044.8, Apr. 5, 2016.

* cited by examiner

*Primary Examiner* — Marc Armand
*Assistant Examiner* — Wilner Jean Baptiste

(57) ABSTRACT

A molded semiconductor package comprises a substrate, a semiconductor die mounted on the substrate, a molding compound encircling the die on the substrate, and one or more heat conductors in the molding compound that are thermally coupled to the substrate. Advantageously, the heat conductors are mounted in the molding compound near one or more of the corners of the die. The package may also include a lid. The heat conductors produce a more uniform distribution of heat in the substrate. The package is assembled by mounting the die on the substrate, mounting the heat conductors on the substrate and applying the molding compound to the substrate, the die, and the heat conductors mounted on the substrate. For packages that use a lid, the lid is then secured to the package and coupled to the heat conductors.

20 Claims, 2 Drawing Sheets

HEAT SPREADING IN MOLDED SEMICONDUCTOR PACKAGES

BACKGROUND

This relates to semiconductor packages and their manufacture and, in particular, to improvements in dissipation of heat from semiconductor devices in such packages.

The dissipation of heat generated during the operation of semiconductor devices is a major concern to developers at all levels of integration of such devices. Even the tiniest improvements are of considerable value, in part, because of the large numbers of semiconductor devices that are found in the typical products that use them.

SUMMARY

The present invention is an improvement in a molded semiconductor package and the method for its manufacture. The package comprises a substrate, a semiconductor die mounted on the substrate, a molding compound encircling the die on the substrate, and one or more heat conductors in the molding compound that are thermally coupled to the substrate. The package may also include a lid. Advantageously, the heat conductors are mounted in the molding compound near one or more of the corners of the die. The heat conductors produce a more uniform dissipation of heat from the die.

The package is assembled by mounting the die on the substrate, mounting the heat conductors on the substrate and applying the molding compound to the substrate, the die, and the heat conductors mounted on the substrate. For packages that use a lid, the lid is then secured to the package and coupled to the heat conductors.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
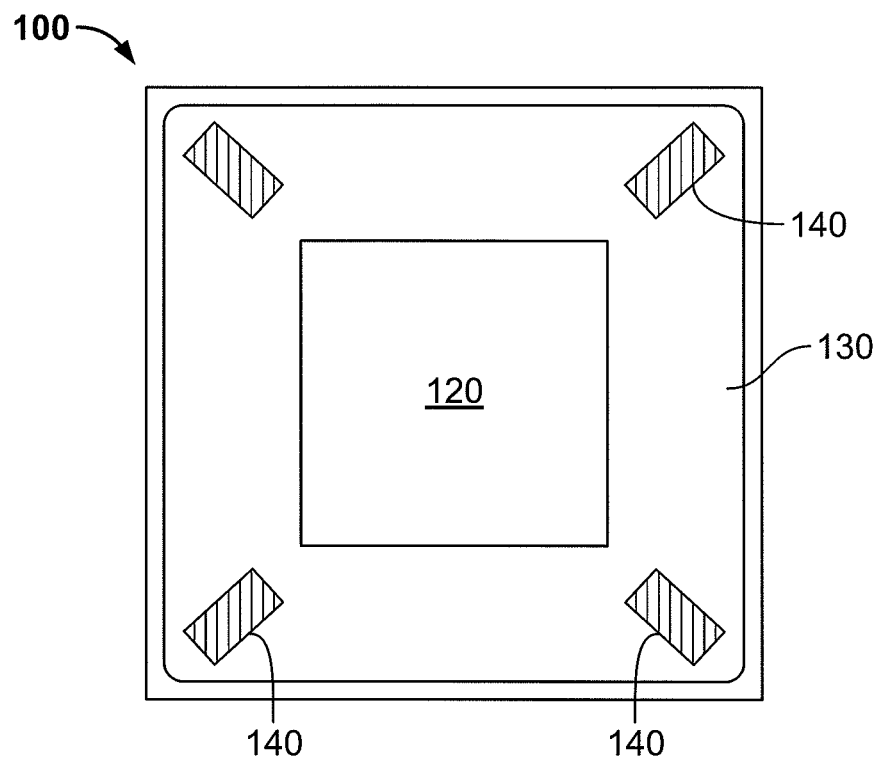
FIG. 1 is a top view of an illustrative embodiment of the invention.
Figure 2:
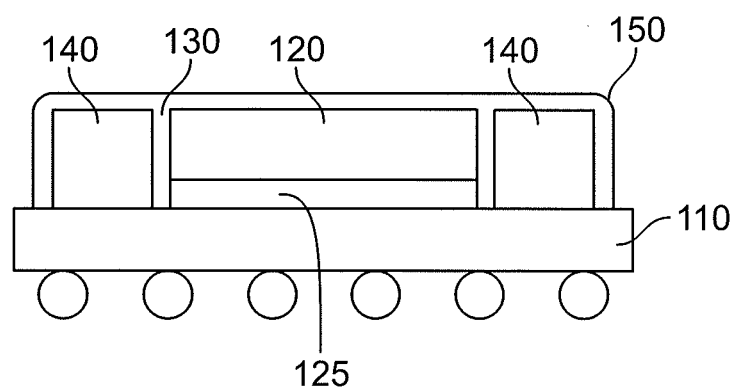
FIG. 2 is a side view of one version of the embodiment of FIG. 1.

FIG. 1 is a top view of an illustrative embodiment of a semiconductor package 100 of the present invention with its lid removed; and FIG. 2 is a side view of the same package. Package 100 comprises a substrate 110, a semiconductor die 120 mounted on the substrate, a molding compound 130 encircling the die on the substrate, one or more heat conductors 140 in the molding compound that are thermally coupled to the substrate, and a lid 150 (shown in FIG. 2) that covers molding compound 130. Advantageously, heat conductors 140 are mounted in molding compound 130 near one or more of the corners of die 110; and preferably there is at least one heat conductor 140 at each corner of die 110. The heat conductors produce a more uniform dissipation of heat from the die.

Substrate 110, die 120, molding compound 130, and lid 150 are conventional. Substrate 110 is typically a molded plastic that provides mechanical support for the die. A plurality of metal layers are formed in the plastic and on the major surfaces of the substrate to provide electrical connection between the die and solder balls or solder bumps on the outside of the package. Semiconductor die 120 is typically made of Silicon but may be made of other semiconductor materials such as Germanium or various III-V semiconductor compounds. Ordinarily, die 120 is rectangular having been separated (or singulated) from a large rectangular array of identical dies formed in a wafer of semiconductor material. The die is made so that numerous integrated circuits are formed in one major surface of the die which is frequently referred to as the active or front side of the die. The die is typically mounted on the substrate with the front side facing the substrate; but the die could also be mounted so that the front side faces away from the substrate. In the illustrative embodiment of FIG. 2, the front side is identified as element 125 and is mounted so that it is facing substrate 110. Illustrative examples of suitable molding compounds are biphenyl epoxy resins and cresol novolac resins.

Heat conductors 140 illustratively are rectangular parallelepipeds in shape. Numerous other shapes such as cylinders and tubes may also be used. Where a lid is used as in the case of the embodiment of FIG. 2, heat conductors 140 should be high enough that they can be thermally coupled to the lid as well as the substrate. The length and thickness of the heat conductors can vary widely depending on the number of heat conductors used and the amount of heat they are used to dissipate. Heat conductors 140 may be made of any material that conducts heat such as metals and metal oxides. Illustratively, they are made of at least one of copper, aluminum, copper oxide and aluminum oxide.

Figure 3:
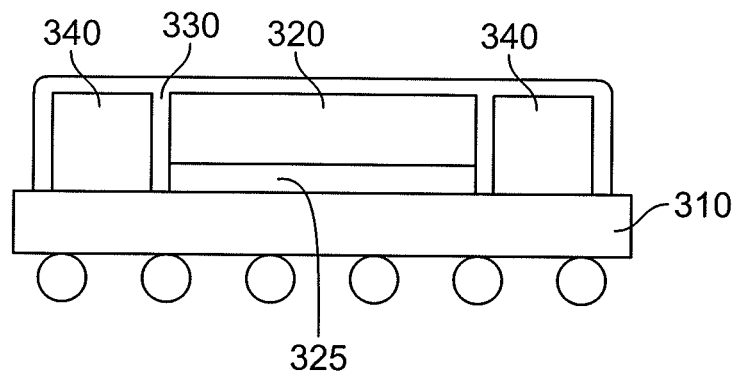
FIG. 3 is a side view of second version of the embodiment of FIG. 1.

The invention may be practiced with or without lid 150. FIG. 3 depicts a second embodiment of the invention, package 300, having the same elements as the embodiment of FIGS. 1 and 2 but no lid. Aside from the absence of a lid, package 300 is the same as package 100 and comprises similar elements bearing the same element numbers incremented by 200. Specifically, package 300 comprises a substrate 310, a semiconductor die 320 mounted on the substrate, a molding compound 330 encircling the die on the substrate, and one or more heat conductors 340 in the molding compound that are thermally coupled to the substrate. Advantageously, heat conductors 340 are mounted in molding compound 330 at one and preferably all corners of die 310.

Heat conductors 140 and 340 improve the dissipation of heat from the semiconductor die 120. Without the heat conductors, heat tends to be dissipated directly upwards from the die through the lid (if present) and directly downwards from the die through the substrate. However, there is relatively little heat dissipation through the peripheral portions of the substrate and lid that extend beyond the sides of the die. With heat conductors 140, significant heat that is dissipated sideways from the die is directed by the heat conductors downwards to the peripheral portions of the substrate and upwards to the peripheral portions of the lid, if a lid is used, or to the environment.

Figure 4:
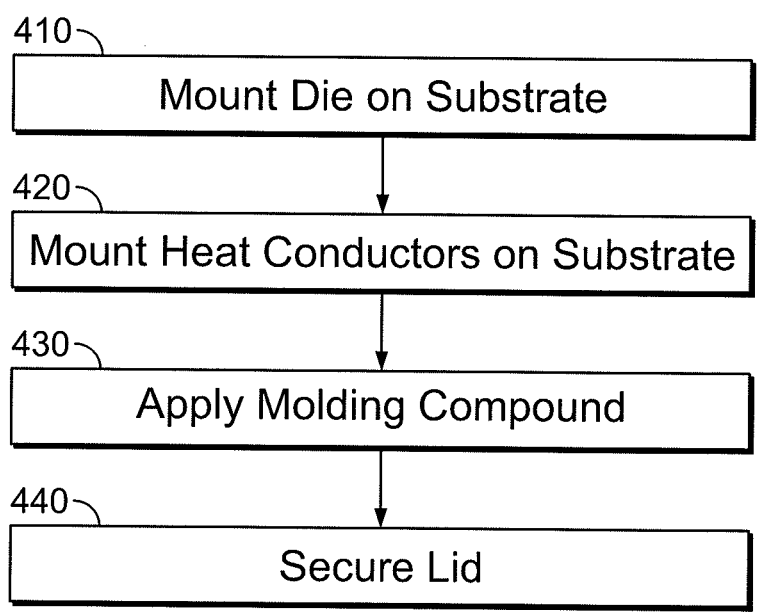
FIG. 4 is a flowchart depicting illustrative steps for forming the embodiments of FIGS. 1-3.

FIG. 4 is a flowchart depicting illustrative steps for assembling package 100 or package 300. The package is assembled by mounting the die on the substrate at step 410; mounting the heat conductors on the substrate at step 420; and applying the molding compound to the substrate, the die, and the heat conductors mounted on the substrate at step 430. For packages that use a lid, the lid is then secured to the package and coupled to the heat conductors at step 440.

As will be apparent to those skilled in the art, numerous variations may be practiced within the spirit and scope of the present invention. For example, the number, size, shape, location, and orientation of the heat conductors may be varied. While it is preferred that the heat conductors be placed at the corners of the die, one or more heat conductors may also be placed along the sides of the die. While the heat conductors have been illustrated as rectangular parallelepipeds, numerous other shapes such as cylinders or tubes may be used.

What is claimed is:

1. A structure comprising:
a substrate;
a semiconductor die mounted on the substrate, wherein the semiconductor die comprises first, second, third, and fourth corners;
molding material encircling the semiconductor die; and
first, second, third, and fourth heat conductors embedded in the molding material and extending upward from the substrate and thermally connected with the substrate, wherein the first, second, third, and fourth heat conductors are mounted on the substrate near the first, second, third, and fourth corners, respectively, of the semiconductor die.

2. The structure of claim 1 wherein the substrate comprises a molded plastic and a plurality of metal layers formed in the molded plastic and on major surfaces of the substrate.

3. The structure of claim 1 wherein the first, second, third, and fourth heat conductors are made of at least one of the group consisting of copper, aluminum, copper oxide, and aluminum oxide.

4. The structure of claim 1 wherein the first, second, third, and fourth heat conductors are posts that are rectangular parallelepipeds, cylinders or tubes in shape.

5. The structure of claim 4 wherein the semiconductor die is rectangular in shape.

6. The structure of claim 1 wherein a material that forms each of the first, second, third, and fourth heat conductors extends from a lid on the molding material to the substrate.

7. The structure of claim 1 wherein the molding material is a biphenyl epoxy resin or a cresol novolac resin.

8. The structure of claim 1 further comprising a lid on the molding material, wherein each of the first, second, third, and fourth heat conductors is thermally coupled to the lid.

9. A structure comprising:
a substrate comprising a molded plastic and a plurality of metal layers formed in the molded plastic and on major surfaces of the substrate;
a semiconductor die mounted on the substrate;
molding material encircling the semiconductor die;
first, second, third, and fourth heat conductors embedded in the molding material and extending upward from the substrate and thermally connected with the substrate, wherein the first, second, third, and fourth heat conductors are mounted on the substrate near first, second, third, and fourth corners, respectively, of the semiconductor die, and
a lid on the molding material, wherein each of the first, second, third, and fourth heat conductors extends from the lid to the substrate.

10. The structure of claim 9 wherein the first, second, third, and fourth heat conductors are made of metal or metal oxide, and wherein the first, second, third, and fourth heat conductors are thermally coupled to the lid.

11. The structure of claim 9 wherein the first, second, third, and fourth heat conductors are made of at least one of the group consisting of copper, aluminum, copper oxide, and aluminum oxide.

12. The structure of claim 9 wherein the first, second, third, and fourth heat conductors are posts that are rectangular parallelepipeds in shape.

13. The structure of claim 12 wherein the semiconductor die is rectangular in shape.

14. The structure of claim 9 wherein the plurality of metal layers provide electrical connection between the semiconductor die and solder balls or solder bumps.

15. The structure of claim 9 wherein the molding material is a biphenyl epoxy resin or a cresol novolac resin.

16. A method for forming a semiconductor package comprising:
mounting a semiconductor die on a substrate, wherein the semiconductor die comprises first, second, third, and fourth corners,
mounting first, second, third, and fourth heat conductors on the substrate around the semiconductor die, and
applying a molding material to the substrate, the first, second, third, and fourth heat conductors, and the semiconductor die, wherein the first, second, third, and fourth heat conductors are mounted on the substrate near the first, second, third, and fourth corners, respectively, of the semiconductor die.

17. The method of claim 16 further comprising mounting a lid on the molding material, wherein each of the first, second, third, and fourth heat conductors is thermally coupled to the lid.

18. The method of claim 16 wherein the substrate comprises a molded plastic and a plurality of metal layers formed in the molded plastic and on major surfaces of the substrate.

19. The method of claim 16 wherein the semiconductor die is rectangular, and wherein the first, second, third, and fourth heat conductors are posts.

20. The method of claim 16 wherein the first, second, third, and fourth heat conductors are made of metal or metal oxide.

* * * * *